United States Patent
Hsieh

(10) Patent No.: US 8,564,052 B2
(45) Date of Patent: Oct. 22, 2013

(54) TRENCH MOSFET WITH TRENCHED FLOATING GATES IN TERMINATION

(75) Inventor: Fu-Yuan Hsieh, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 225 days.

(21) Appl. No.: 13/169,314

(22) Filed: Jun. 27, 2011

(65) Prior Publication Data

US 2011/0254070 A1   Oct. 20, 2011

Related U.S. Application Data

(63) Continuation-in-part of application No. 12/591,467, filed on Nov. 20, 2009, now Pat. No. 7,989,887.

(51) Int. Cl.
*H01L 29/76* (2006.01)
*H01L 29/94* (2006.01)

(52) U.S. Cl.
USPC ........... 257/330; 257/329; 257/331; 257/332; 257/341; 438/259; 438/270; 438/271

(58) Field of Classification Search
USPC .................. 257/329–333, 341, 374, E29.262; 438/259, 270, 271
See application file for complete search history.

(56) References Cited

U.S. PATENT DOCUMENTS

| 7,893,488 B2 * | 2/2011 | Hebert | 257/330 |
| 7,989,887 B2 * | 8/2011 | Hsieh | 257/330 |

\* cited by examiner

*Primary Examiner* — Theresa T Doan
(74) *Attorney, Agent, or Firm* — Bacon & Thomas, PLLC

(57) ABSTRACT

A trench MOSFET comprising a plurality of transistor cells, multiple trenched floating gates in termination area is disclosed. The trenched floating gates have trench depth equal to or deeper than body junction depth of body regions in active area. In some preferred embodiments, the trench MOSFET further comprises a gate metal runner surrounding outside the source metal and extending to the gate metal pad. Furthermore, the termination area further comprises an EPR surrounding outside the trenched floating gates.

5 Claims, 20 Drawing Sheets

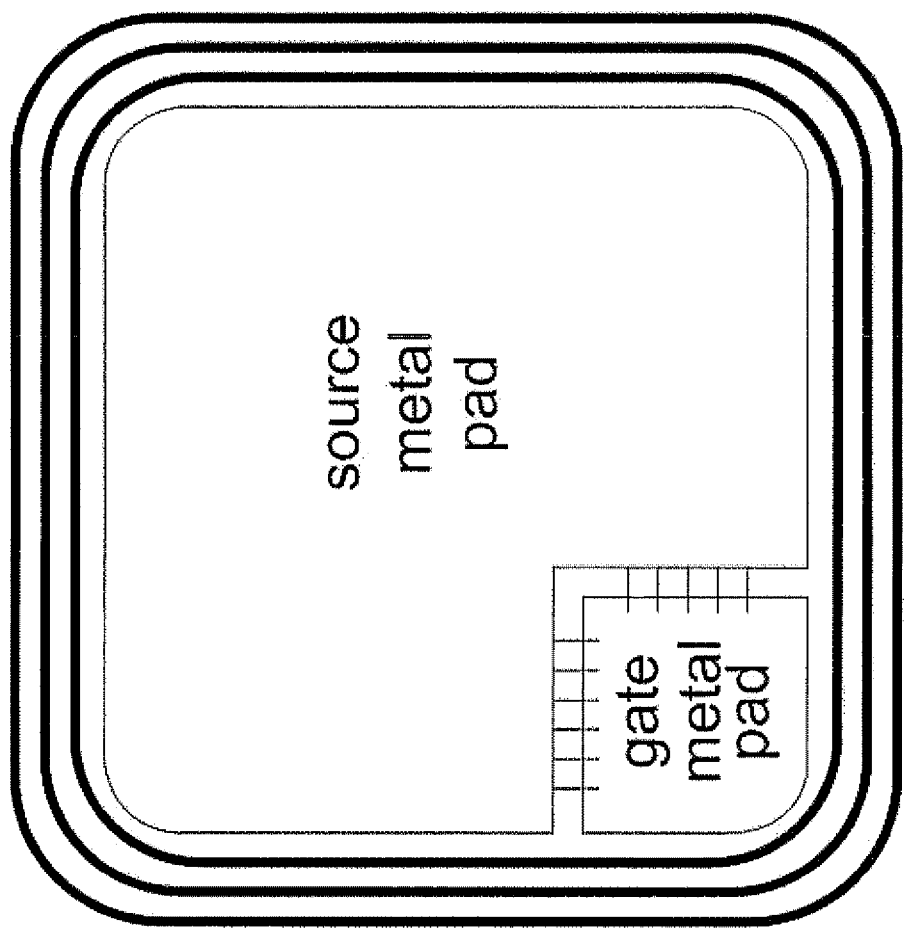

US 8,564,052 B2

TRENCH MOSFET WITH TRENCHED FLOATING GATES IN TERMINATION

CROSS REFERENCE TO RELATED APPLICATIONS

This application is a continuation-in-part (CIP) of U.S. application Ser. No. 12/591,467, filed on Nov. 20, 2009.

FIELD OF THE INVENTION

This invention relates generally to the cell structure, device configuration and fabrication process of power semiconductor devices. More particularly, this invention relates to a novel and improved cell structure, device configuration and improved process for fabricating trench metal-oxide-semiconductor-field-effect-transistors (MOSFETs) with trenched floating gates in termination to maintain a high breakdown voltage and to achieve a lower gate-to-drain charge Qgd and lower fabrication cost.

BACKGROUND OF THE INVENTION

Typical structures of trench metal-oxide-semiconductor-field-effect-transistors (MOSFETs) having trenched floating gates as termination in prior arts are encountering technical problems. For example, in U.S. Pat. No. 6,462,376, a trench MOSFET was disclosed with n+ source regions disposed in termination area comprising multiple of trenched floating gates, as shown in FIG. 1A. In the termination area, a plurality of the n+ source regions 120 are disposed between two adjacent of the trenched floating gates 111. This kind of structure will cause heavily leakage current between drain region and the source region because that channel region is turned on in the termination area due to a plurality of P body regions 108 having floating voltage and the trenched floating gates 111 are not shorted together with the n+ source regions 120 at drain/source reversed bias. An electrical current will flow from the drain region through the channel region between two adjacent of the trenched floating gates 111 in the termination area to the n+ source region 120 in active area.

Please refer to FIG. 1B for another prior art U.S. Pat. No. 7,511,339 which disclosed another trench MOSFET structure without having source regions in the termination area but with depth of the trenched floating gates 110 (TFd) shallower than depth of floating deep P body regions 130 (Pd). However, from experimental results of the relationship between breakdown voltage (BV) and difference between TFd and Pd in FIG. 2, it can bee seen that, the breakdown voltage is significantly degraded as the difference (TFd−Pd) is getting smaller when TFd<Pd, thus causing low breakdown voltage in the termination area due to poor isolation between drain region and the source region by the trenched floating gates 110 having shallower depth in the termination area. The floating deep P body regions 130 are electrically connected together by charge depletion of the floating deep P body regions 130 at drain/source reversed bias because the trenched floating gates 110 is shallower than the floating deep P body regions 130. Therefore, an electrically current will directly flow from edge of the termination area to the source region in the active area without being blocked by the trenched floating gates 110 in the termination area.

Furthermore, in order to ensure the potential around the device edge has same potential after sawing for uniform breakdown voltage, an equal potential ring (EPR, similarly hereinafter) is normally formed in the termination area of a trench MOSFET surrounding source metal pad and gate metal pad of the trench MOSFET Therefore, there is still a need in the art of the semiconductor device design and fabrication, particularly for trench MOSFET design and fabrication, to provide a novel cell structure, device configuration and fabrication process that would resolve these difficulties and design limitations. Specifically, it is desirable to maintain high breakdown voltage in the termination area of a trench MOSFET.

SUMMARY OF THE INVENTION

The present invention provides trench MOSFET having a plurality of transistor cells in active area and multiple trenched floating gates in termination area, specifically, the trench depth of the trenched floating gates in the termination area is equal to or deeper than junction of body regions surrounding the trenched floating gates without having source regions disposed wherein to maintain high breakdown voltage. Some preferred trench MOSFET transistor cells exhibit low gate-to-drain charge Qgd.

According to one aspect, the invention features a trench MOSFET having a plurality of transistor cells in the active area and multiple trenched floating gates in the termination area, further includes: (a) a substrate of a first conductivity type; (b) an epitaxial layer of the first conductivity type grown on the substrate, the epitaxial layer having a lower doping concentration than the substrate; (c) a source region of the first conductivity type formed near top surface of the epitaxial layer only within an active area, the source region having a doping concentration higher than the epitaxial layer; (d) a first type body region of a second conductivity type opposite to the first conductivity type formed underneath the source region in the active area; (e) a second type body region of the second conductivity type formed in the epitaxial layer from top surface of the epitaxial layer around outside of the active area including the termination area, and the source region being not disposed on the top of the second type body region; (f) an contact insulation layer formed on the epitaxial layer; (g) a first type trenched gate in the active area surrounded by the source region and the first type body region, extending into the epitaxial layer and filled with a gate conductive layer over a gate oxide layer; (h) a second type trenched gate lined by the gate oxide layer and filled with the gate conductive layer for gate connection, the second type trenched gate having greater trench width and trench depth than the first type trenched gate in the active area, wherein the second type trenched gate being surrounded by the second type body region and extending into the epitaxial layer; (i) at least three trenched floating gates in parallel formed in the termination area around outside of the active area, the trenched floating gates being surrounded by the second type body region and filled with the gate conductive layer having floating voltage over the gate oxide layer, wherein the trenched floating gates having trench depth equal to or deeper than body junction of the second type body region; (j) the second type body region which surrounding the trenched floating gates having floating voltage; (k) a trenched source-body contact filled with a metal plug in the active area, penetrating through the contact insulation layer and the source region and extending into the first type body region, the metal plug being connected to a source metal formed on the contact insulation layer; (l) a trenched gate contact penetrating through the insulation layer and extending into the gate conductive layer into the second type trenched gate, wherein the trenched gate contact being filled with the metal plug which connecting the gate conductive layer in the second type trenched gate to a gate metal formed onto the contact insulation layer; and (m) a drain metal on rear side of the substrate, According to another aspect of the present invention, in some preferred embodiment, the trenched floating gates in the termination area have the same trench width and trench depth as the first type trenched gate gates in the active area. In another preferred embodiment, the trenched floating gates in the termination area can be implemented having greater trench width than the first type trenched gates in the active area.

According to another aspect of the present invention, in some preferred embodiment, the trench width of the trenched floating gates in the termination area increases toward the edge of the termination area. In another preferred embodiment, the trench width of the trenched floating gates in the termination area decreases toward the edge of said termination area.

According to another aspect of the present invention, in some preferred embodiment, trench space between every two adjacent of the trenched floating gates in the termination area is equal. In another preferred embodiment, the trench space between every two adjacent of the trenched floating gates in the termination area is increased toward the edge of the termination area.

According to another aspect of the present invention, in some preferred embodiment, the first type trenched gate in the active area is deeper than said first type body region. In another preferred embodiment, the body junction depth of the first type body region is greater than or equal to the trench depth of the first type trenched gate in the active area and the trenched MOSFET further comprises a doped region of the first conductivity type with doping concentration higher than the epitaxial layer wrapping bottom of the first type trenched gate, the second type trenched gate and the trenched floating gates.

According to another aspect of the present invention, in some preferred embodiment, the second type trenched gate for gate connection is only disposed underneath the gate metal pad.

According to another aspect of the present invention, in some preferred embodiment, the trench MOSFET further comprises a gate metal runner surrounding outside of the source metal covering the active area and extends to the gate metal pad used for wire bonding, and the second type trenched gate for gate connection is disposed not only underneath the gate metal pad, but also underneath the gate metal runner. Furthermore, an equal potential ring (EPR) is formed in the termination area and surrounding outside of the trenched floating gates.

According to another aspect of the present invention, in some preferred embodiment, the EPR further comprises an EPR metal plug penetrating through the contact insulation layer and extending into the second type body region, the EPR metal plug is the same material as the metal plug in the trenched source-body contact. In another preferred embodiment, the EPR further comprises an EPR metal covering the EPR metal plug, wherein the EPR metal is disposed onto the contact insulation layer.

Preferred embodiments include one or more of the following features: the trench MOSFET further comprises a body contact region of the second conductivity type surrounding bottom of the trenched source-body contact, the body contact region has a higher doping concentration than the first body region; The trench MOSFET further comprises a trenched body contact penetrating through the contact insulation layer and extending into the second type body region adjacent to the active area, the trenched body contact is filled with the metal plug; the metal plug is tungsten plug; the metal plug is padded by a barrier layer of Ti/TiN or Co/TiN or Ta/TiN; the active area comprises a plurality of closed cells; the active area comprises a plurality of stripe cells; the gate conductive layer is doped poly-silicon layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 19 is top view of a trench MOSFET without gate metal runner according to the present invention.

DETAILED DESCRIPTION OF THE EMBODIMENTS

Figure 1A:
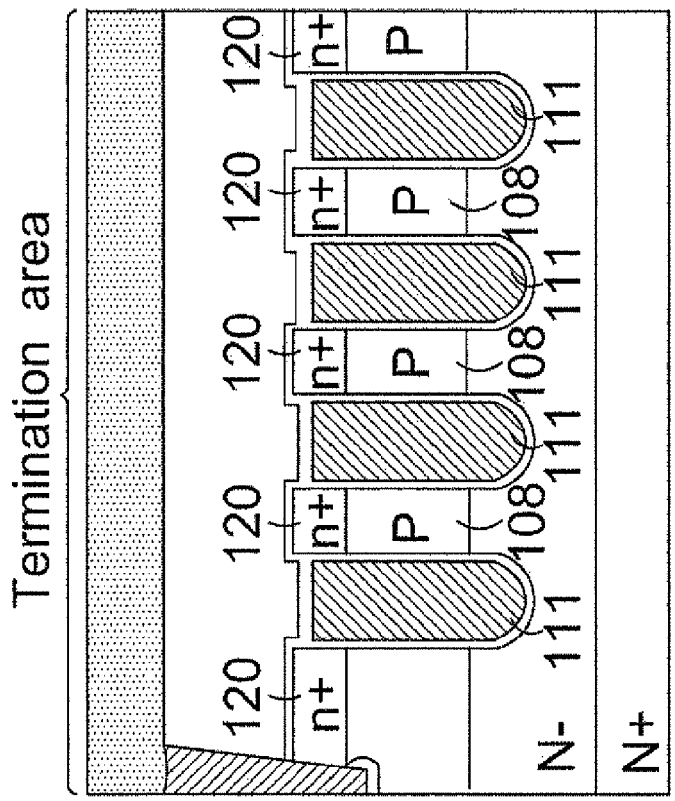
FIG. 1A is a cross-sectional view of a trench MOSFET of prior art.
Figure 1A:
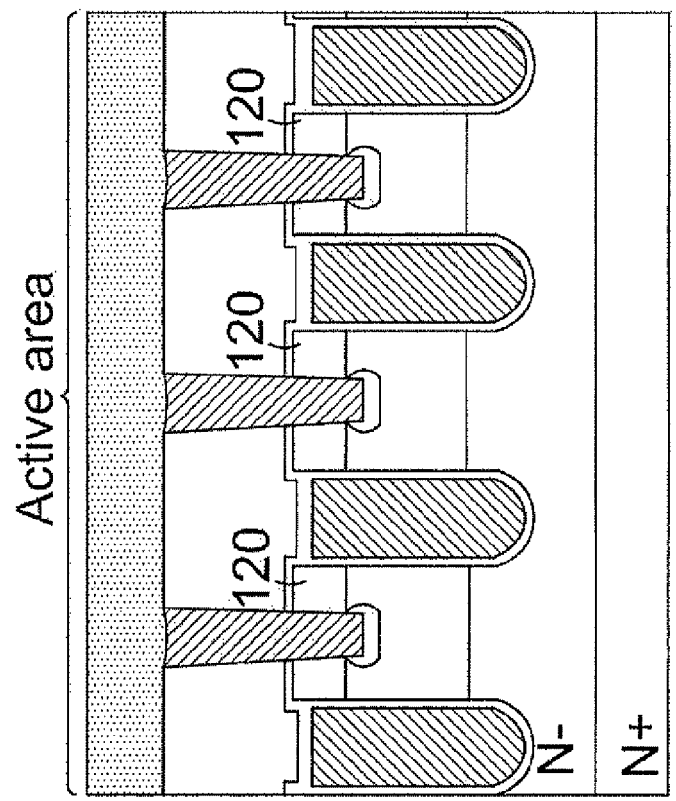
Figure 1B:
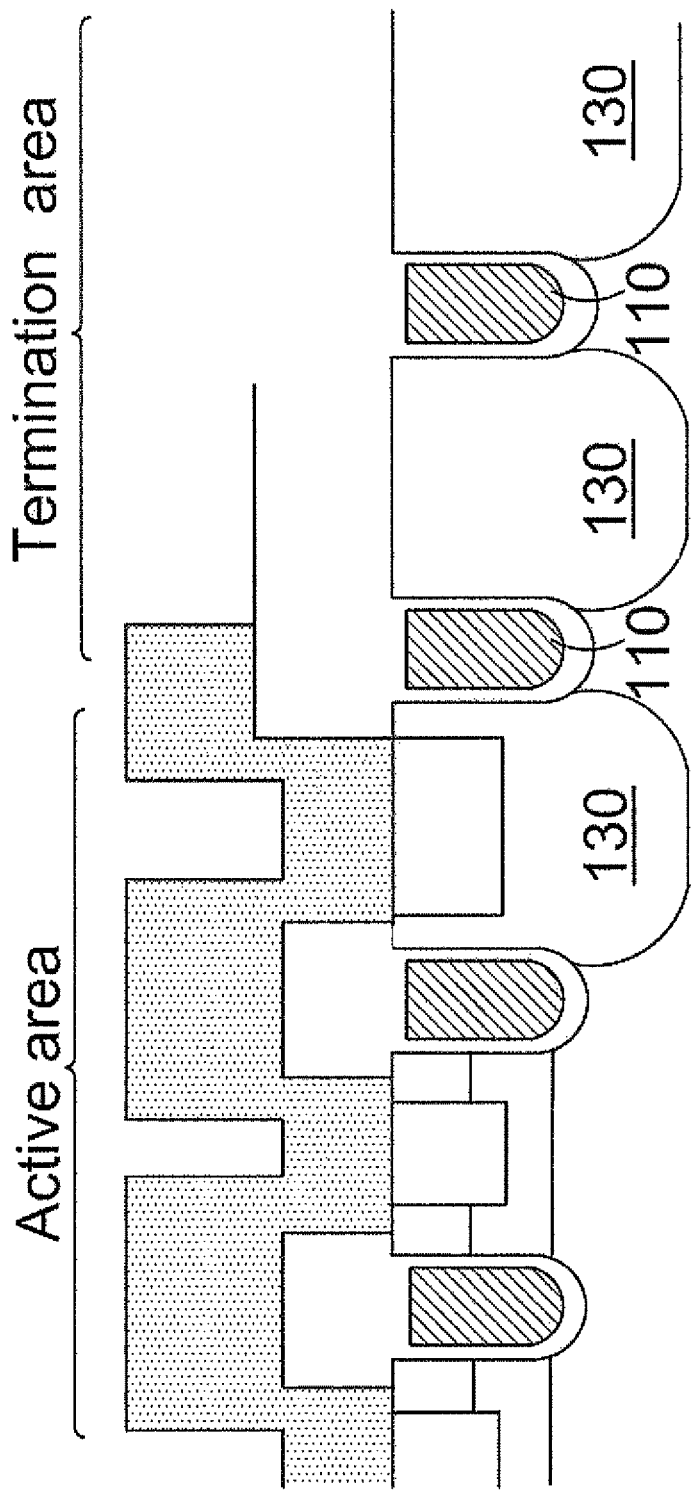
FIG. 1B is a cross-sectional view of a trench MOSFET of another prior art.
Figure 2:
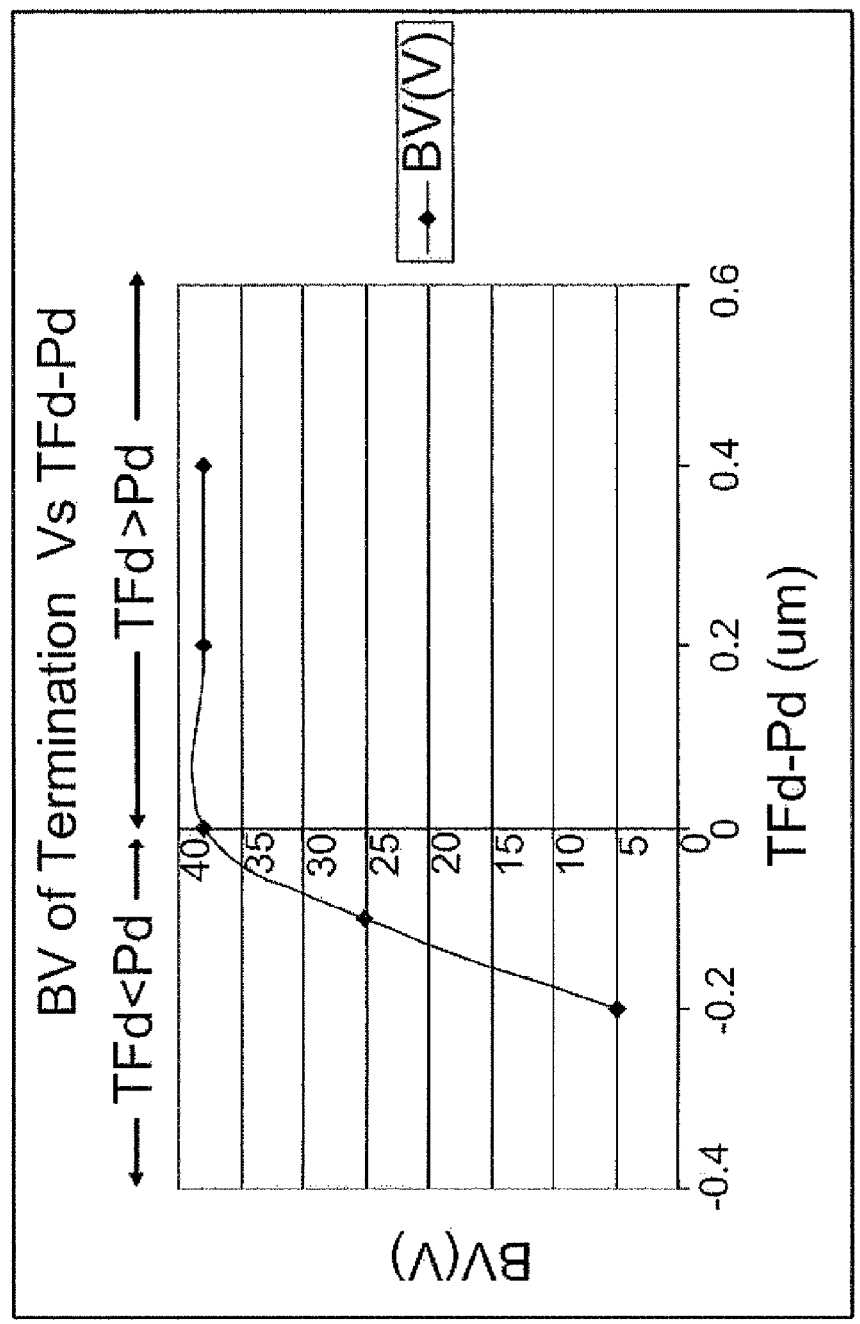
FIG. 2 is an experimental curve showing the relationship between breakdown voltage (BV) and the difference between depth of trenched floating gates and depth of body region (TFd–Pd).
Figure 3:
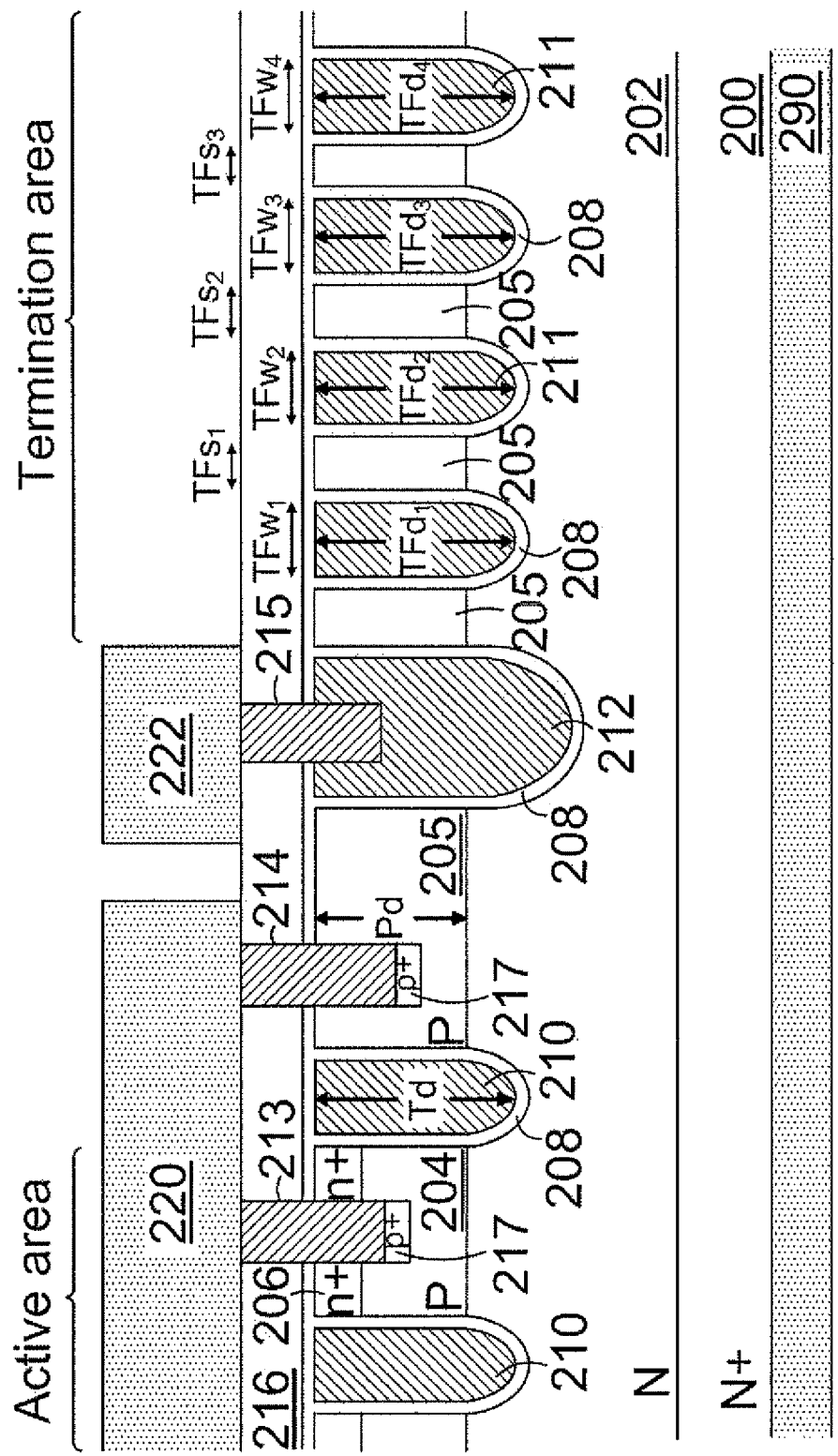
FIG. 3 is a cross-sectional view of a preferred embodiment according to the present invention.

Please refer to FIG. 3 for a preferred embodiment of this invention wherein an N-channel trench MOSFET cell is formed on an N+ substrate 200 with a metal layer 290 on the rear side as drain. Inside an N epitaxial layer 202 onto the N+ substrate 200, a plurality of first type trenched gates 210 are formed in active area, at least a second type trenched gate 212 having greater trench width and depth is formed for gate connection, and at least three trenched floating gates 211 are formed in termination area. The first type trenched gates 210, the second type trenched gate 212 and the trenched floating gates 211 are each filled with a doped poly-silicon layer padded by a gate oxide layer 208 as a single gate electrode. Furthermore, the trenched floating gates 211 have same trench width which are the same as the first type trenched gates 210 in the active area, meanwhile, the trench space between every two adjacent of the trenched floating gates 211 in the termination area is equal or increased toward the edge of the termination area. In upper portion of the N epitaxial layer 202, a plurality of first type P body regions 204 are extending between every two adjacent of the first type trenched gates 210; a plurality of second type P body regions 205 are formed around outside the active area. Near top surface of the first type P body regions 204, a plurality of n+ source regions 206 are formed adjacent to sidewalls of the first type trenched gates 210. Specifically, the depth of the trenched floating gates 211 ($TFd_1$, $TFd_2$, $TFd_3$, ... , as illustrated in FIG. 3) must be equal or deeper than junction depth of the second type P body regions 205 (Pd, as illustrated in FIG. 3) surrounding the trenched floating gates 211 without having the source regions disposed wherein to maintain high breakdown voltage while preventing heavily leakage current, and the depth of the first type trenched gates 210 is deeper than the junction depth of the first type P body regions 204. The N-channel trench MOSFET cell further comprises: a plurality of trenched source-body contacts 213 penetrating a contact insulation layer 216, the n+ source regions 206 and extending into the first type P body regions 204; a trenched body contact 214 penetrating through the contact insulation layer 216 and extending into the second type P body region 205 between a first type trenched gate 210 and the adjacent second type trenched gate 212; and at least one trenched gate contact 215 penetrating through the contact insulation layer 216 and extending into the single gate electrode filled in the at least one second type trenched gate 212. Underneath each of the trenched source-body contact 213 and the trenched body contact 214, there is a p+ body contact region 217 to further reduce contact resistance. The N-channel trench MOSFET cell further comprises a source metal 220 and a gate metal 222 (which is a gate metal runner), the source metal 220 is connected to the n+ source regions 206, the first type P body regions 204 and the second type P body region 205 via metal plugs filled into each the trenched source-body contact 213 and the trenched body contact 214, the gate metal 222 is connected to the at least one second trenched gate 212 via metal plugs filled into the trenched gate contact 215. Since the structure does not have n+ source region between two adjacent trenched floating gates 211, no current will flow from the drain region through channel region to the source regions 206 in the active area even the trenched floating gates are turned on. The N-channel trench MOSFET further comprises a plurality of closed transistor cells, as shown in FIG. 4 or a plurality of stripe transistor cells, as shown in FIG. 5.

Figure 4:
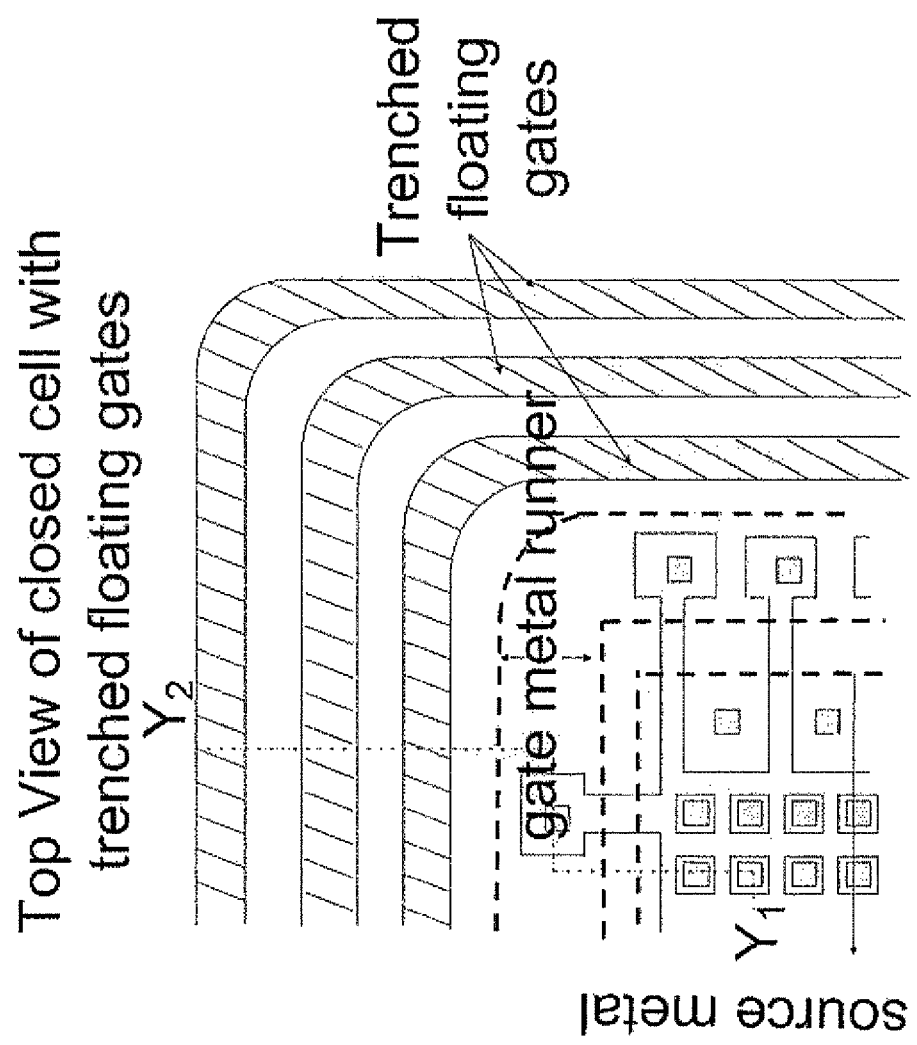
FIG. 4 is a top view of some preferred embodiments having closed cells with trenched floating gates in the termination area according to the present invention.
Figure 5:
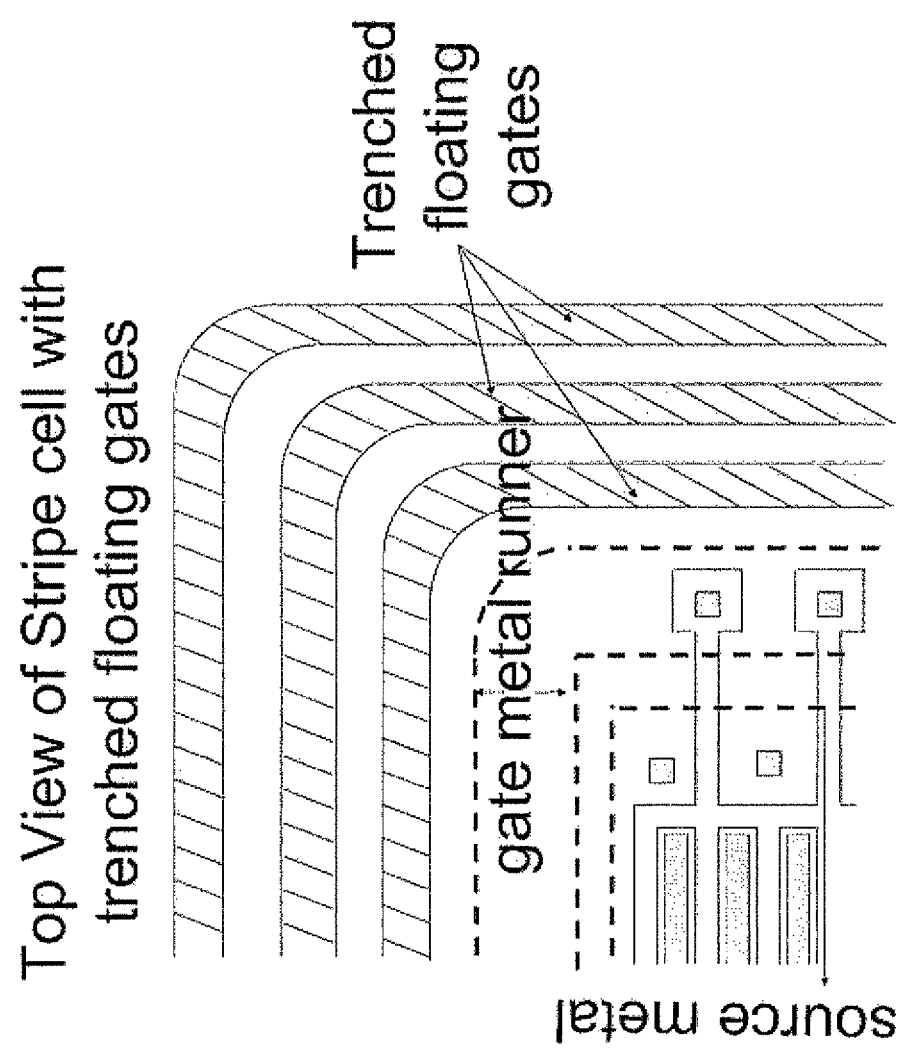
FIG. 5 is a top view of some preferred embodiments having stripe cells with trenched floating gates in the termination area according to the present invention.
Figure 6:
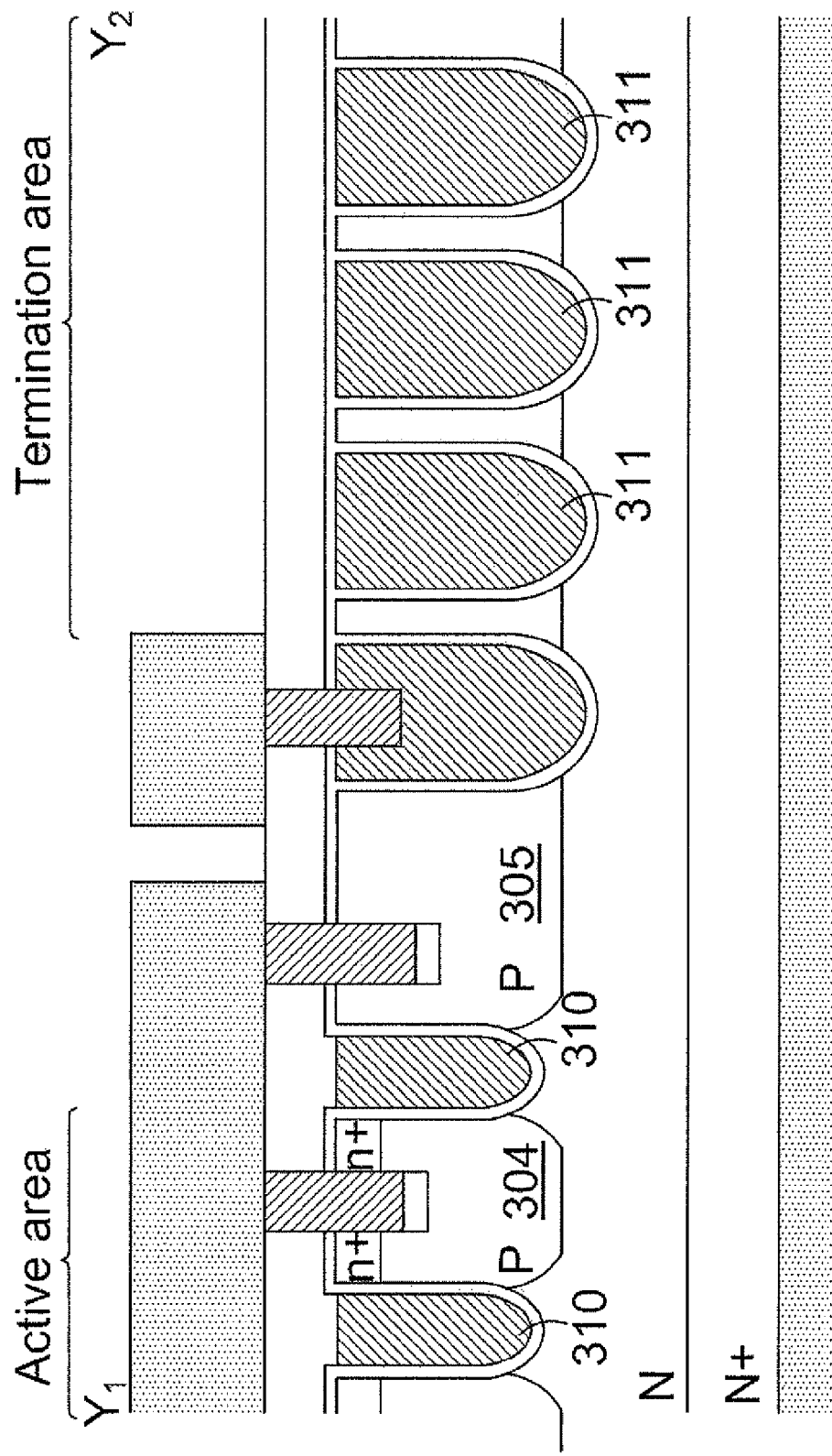
FIG. 6 is a cross-sectional view of another preferred embodiment according to the present invention.
Figure 7:
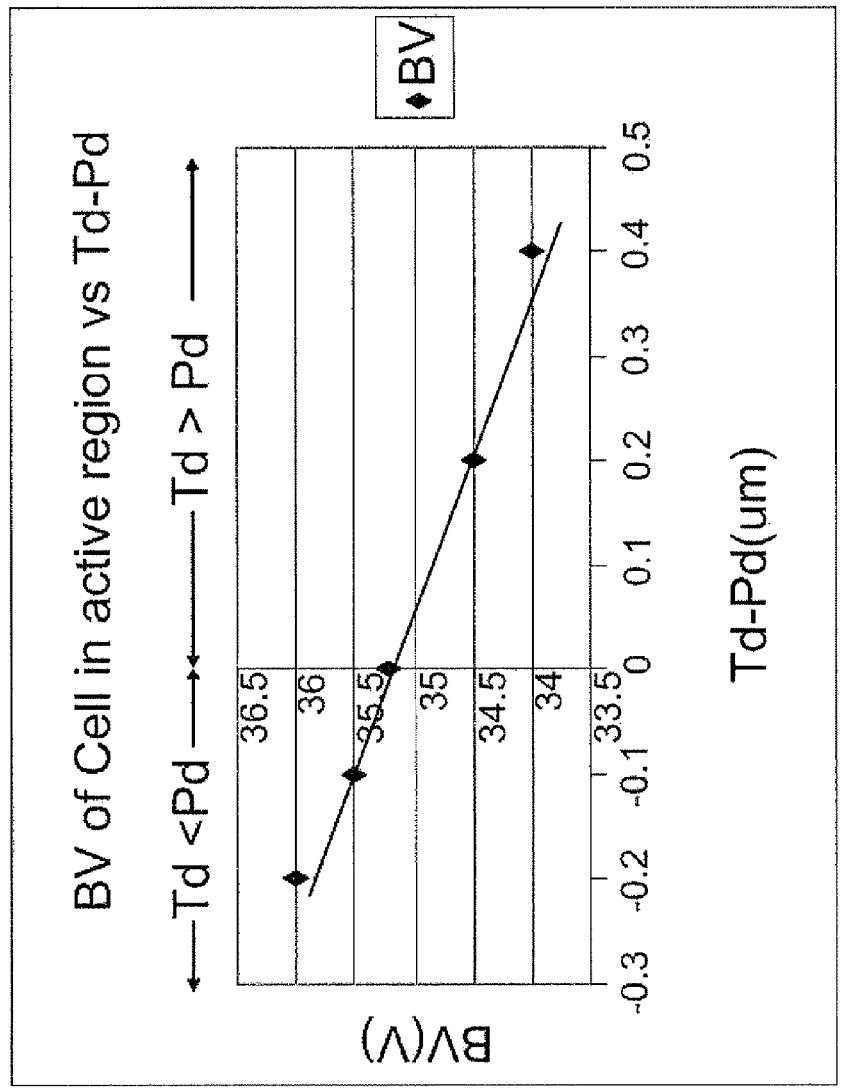
FIG. 7 is an experimental curve showing the relationship between breakdown voltage (BV) in active region and the difference between depth of trenched gates in active region and body region (Td–Pd).
Figure 8:
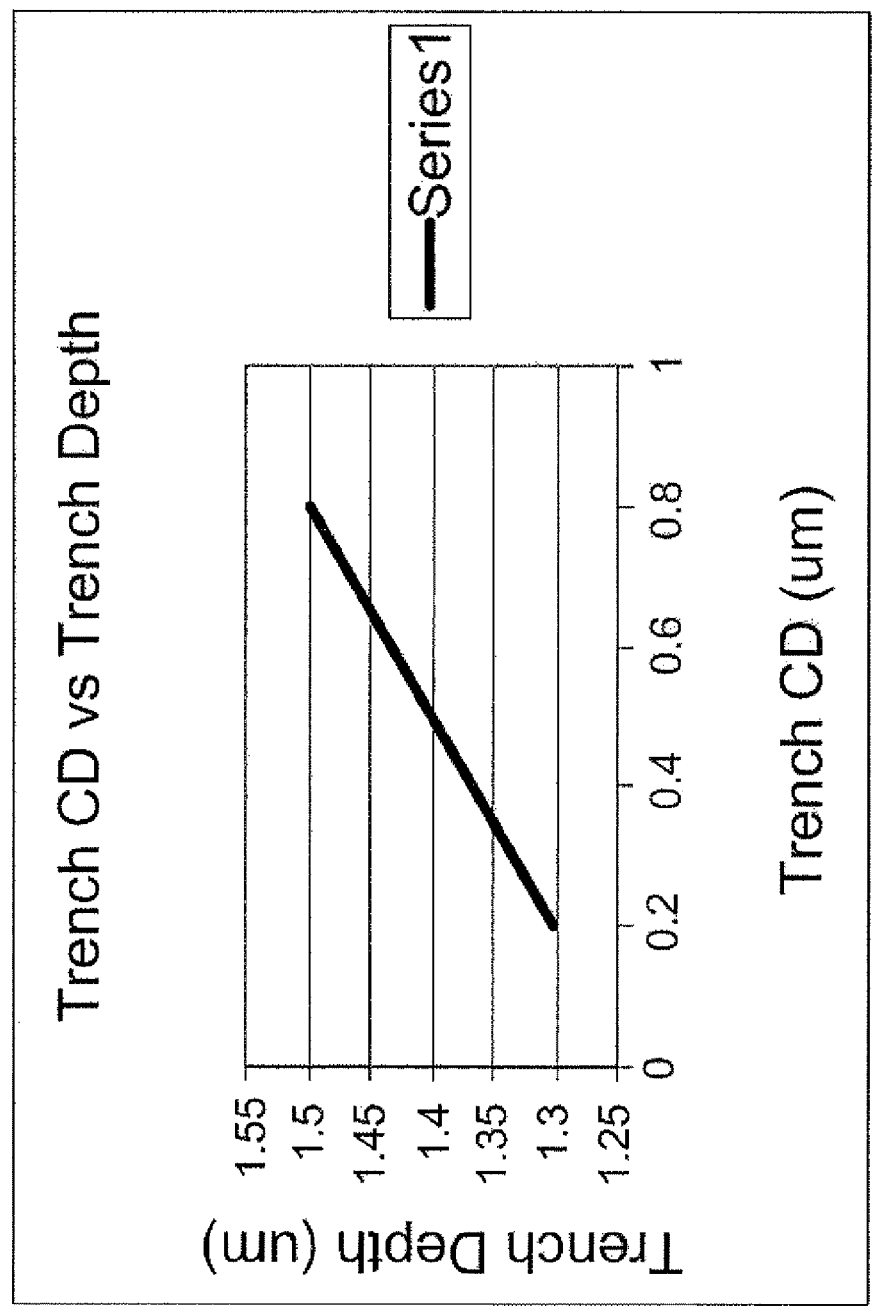
FIG. 8 is an experimental curve showing the relationship between trench CD (Critical Dimension) and trench depth.

FIG. 6 shows another preferred embodiment of the present invention, which is also the $Y_1$-$Y_2$ cross section of FIG. 4, where the disclosed trench MOSFET cell has a similar structure to that in FIG. 3 except that, the at least three trenched floating gates 311 in the termination area have same trench width ($TFw_1$, $TFw_2$, $TFd_3$, ... , as illustrated in FIG. 3) and trench depth which are greater than the plurality of first type trenched gates 310 in the active area. Meanwhile, the depth of the first type trenched gates 310 (Td, as illustrated in FIG. 3) is shallower than the junction depth of the first type P body regions 304 and the second type P body regions 305 to keep enough breakdown voltage in the active area and lower gate-to-drain charge Qgd for the reason that, as shown in FIG. 7, when Td is deeper, the breakdown voltage is lower in the active area and the Qgd is thus higher. By referring FIG. 8 which shows a relationship between trench depth and trench width, the structure can be achieved with single trench etch because the third type trenched floating gates 311 have trench width greater than the first type trenched gates 310, resulting in deeper trench in the trenched floating gates 311 than the first type trenched gates 310. The preferred embodiment has low gate charge due to shallow trench depth while the breakdown voltage is able to be maintained in the termination area without adding extra trench etch.

Figure 9:
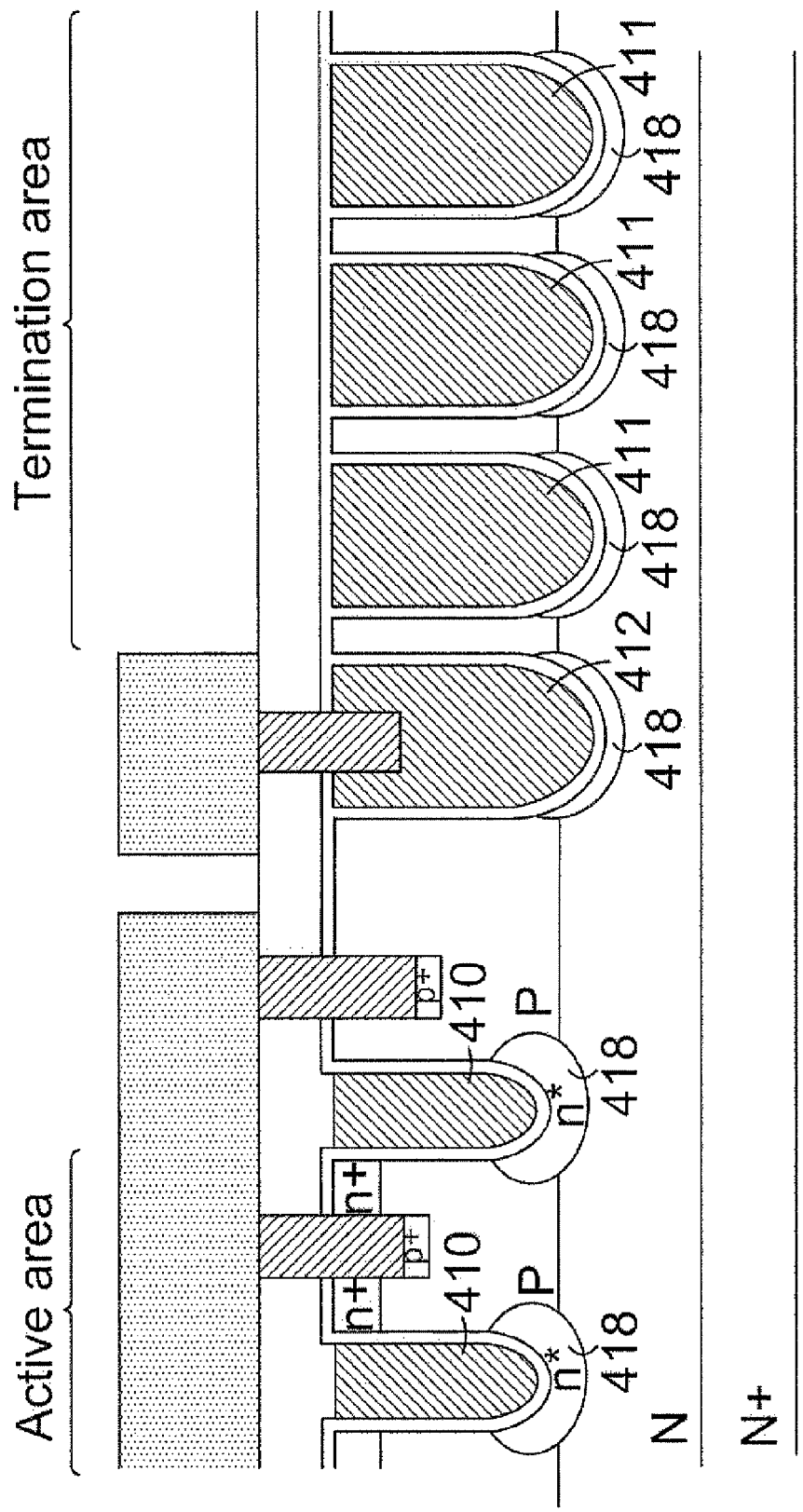
FIG. 9 is a cross-sectional view of another preferred embodiment according to the present invention.

FIG. 9 shows another preferred embodiment of the present invention where the disclosed trench MOSFET cell has a similar structure to that in FIG. 6 except that, there is an n* doped region 418 wrapping bottom of each of the first type trenched gates 410, the second type trenched gate 412 and the trenched floating gates 411 to further reduce drain-to-source resistance Rds.

Figure 10:
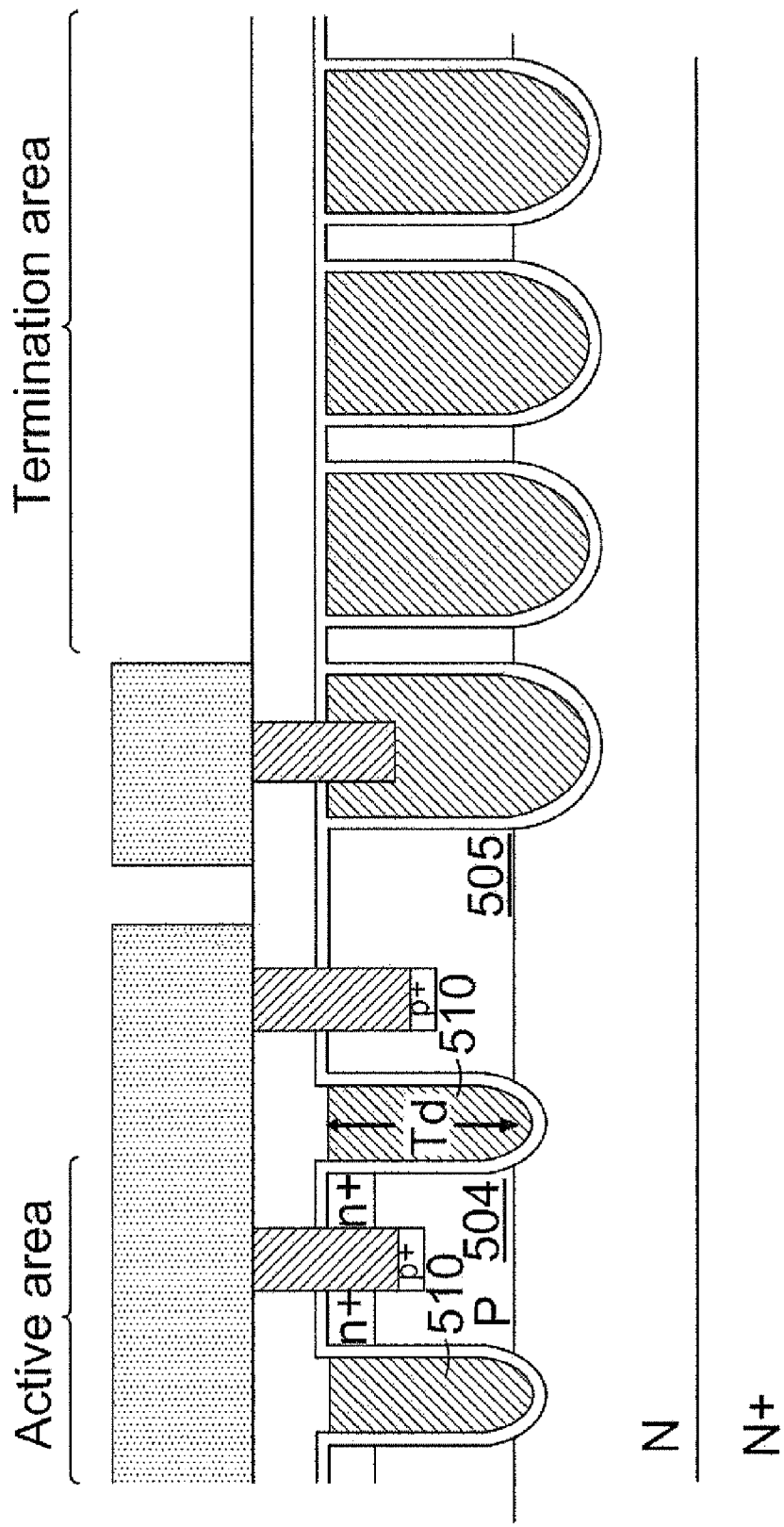
FIG. 10 is a cross-sectional view of another preferred embodiment according to the present invention.

FIG. 10 shows another preferred embodiment of the present invention wherein the disclosed trench MOSFET cell has a similar structure to that in FIG. 6 except that, the depth of the first type trenched gates 510 in the active area is greater than the first type P body regions 504 and the second type P body regions 505.

Figure 11:
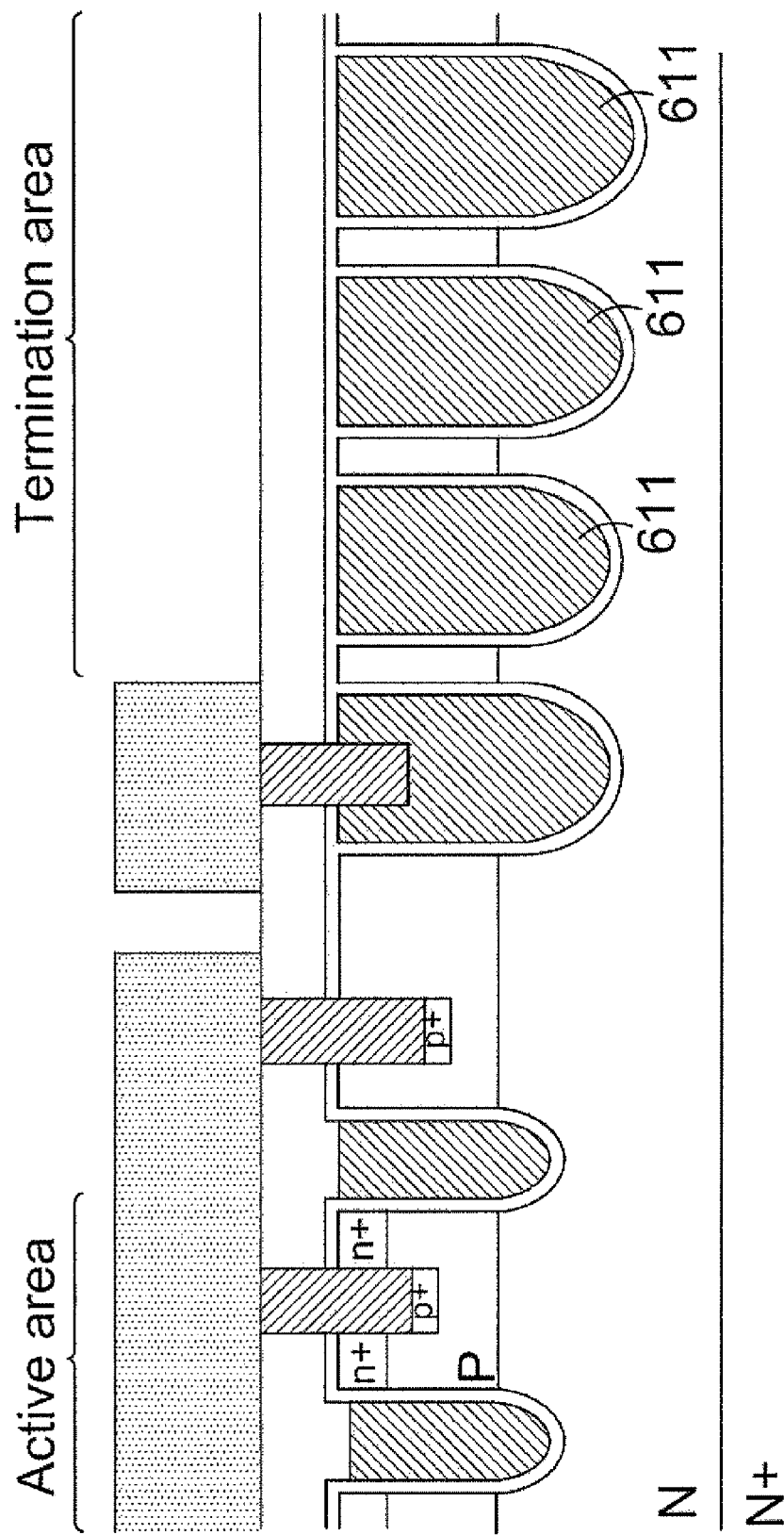
FIG. 11 is a cross-sectional view of another preferred embodiment according to the present invention.

FIG. 11 shows another preferred embodiment of the present invention where the disclosed trench MOSFET cell has a similar structure to that in FIG. 10 except that, in the termination area, the at least three floating gates 611 have different trench depth and trench width which are both greater than the plurality of first type trenched gates 610 in the active area. More specifically, the trench width of the trenched floating gates 611 increases toward the edge of the termination area ($TFw_1$<$TFw_2$<$TFw_3$...), which indicates that, the depth of the trenched floating gates 611 also increases toward the edge of the termination area ($TFd_1$<$TFd_2$<$TFd_3$...) according to FIG. 8. Alternatively, the depth of the trenched floating gates 611 decreases toward the edge of the termination area ($TFw_1$>$TFw_2$>$TFw_3$...).

Figure 12:
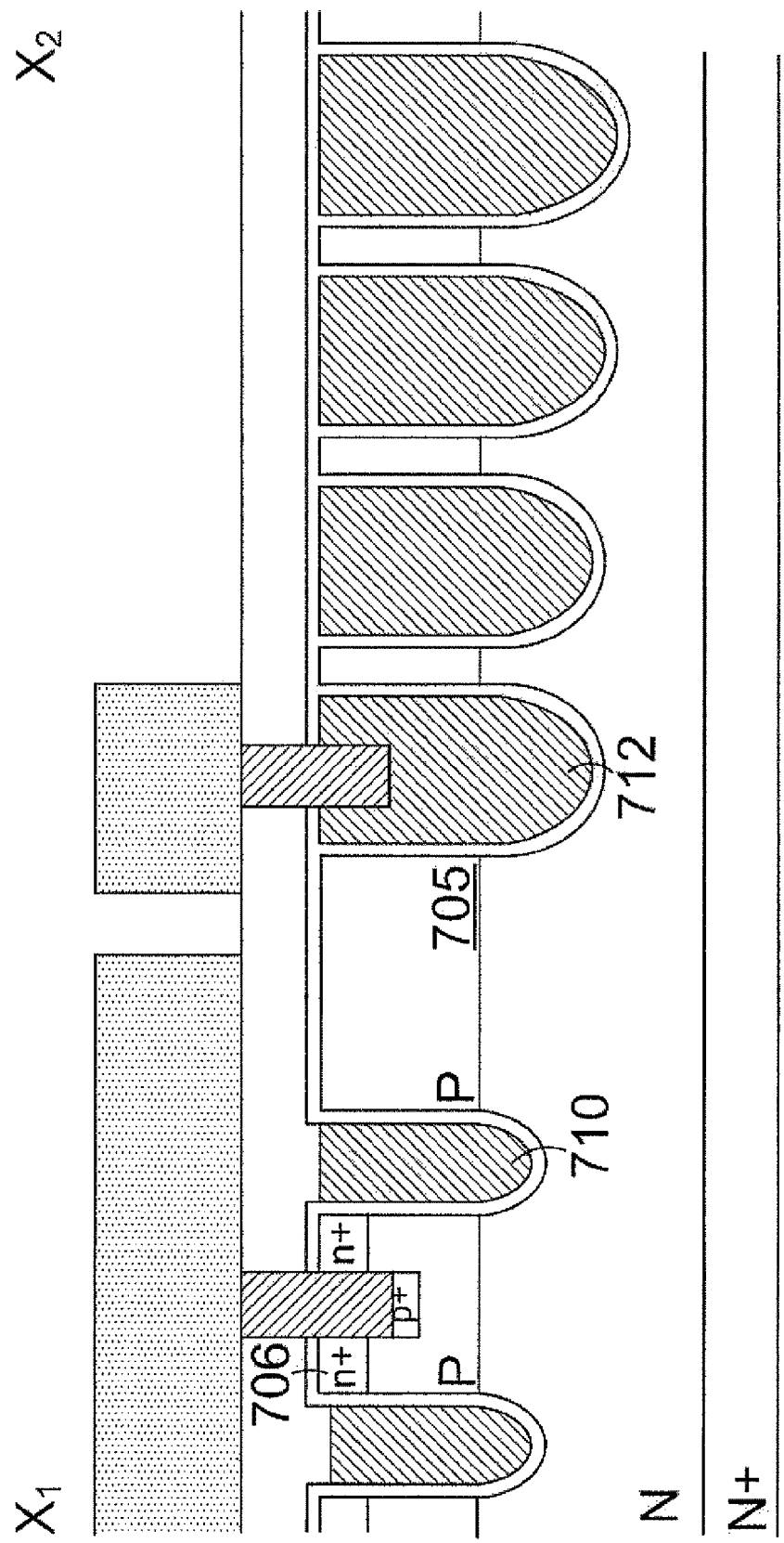
FIG. 12 is a cross-sectional view of another preferred embodiment according to the present invention.
Figure 13:
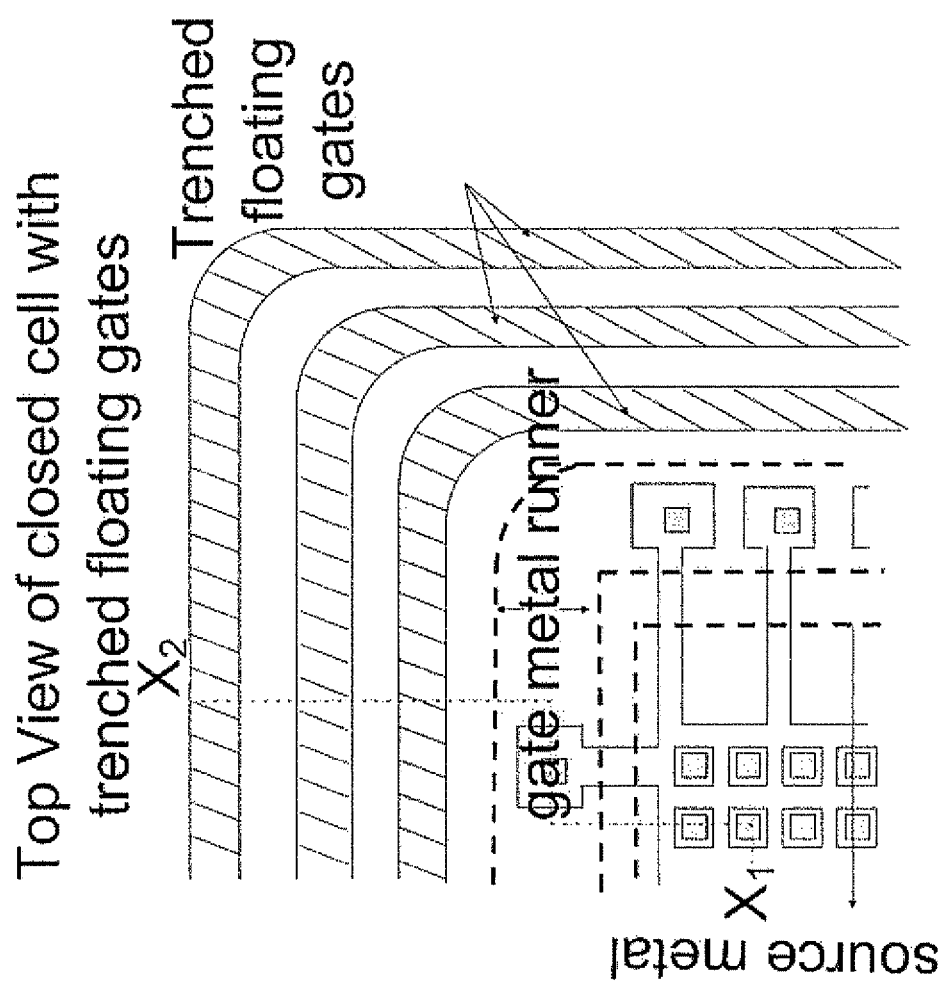
FIG. 13 is a top view of some preferred embodiments having closed cells without trenched body contact according to the present invention.
Figure 14:
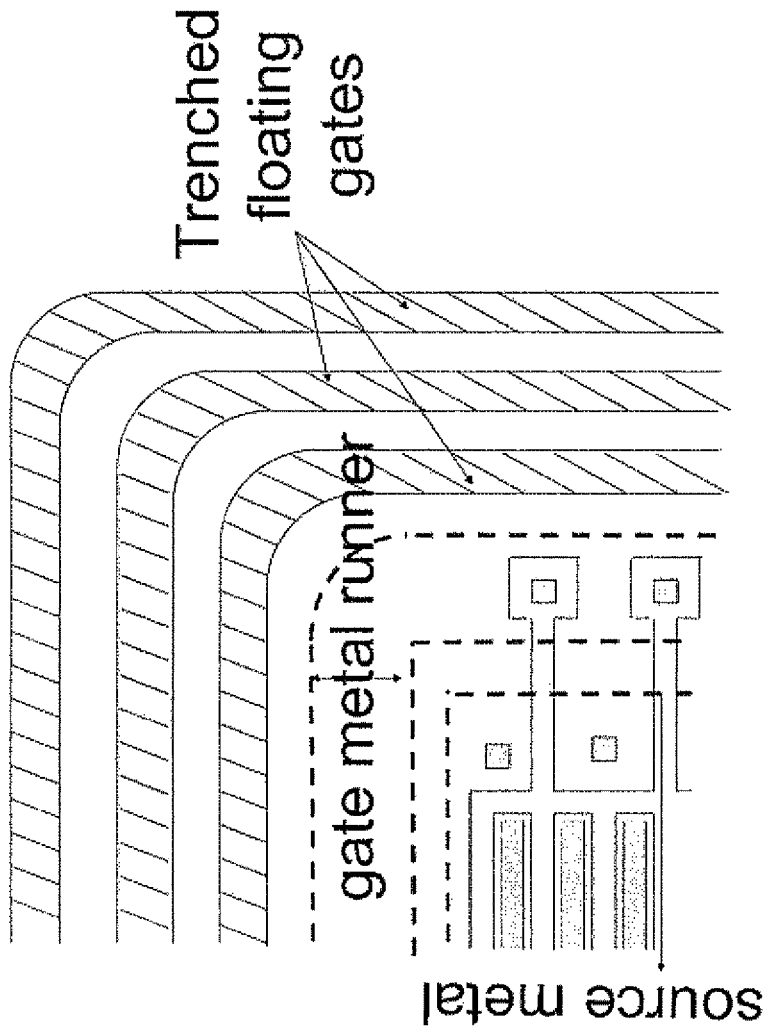
FIG. 14 is a top view of some preferred embodiment having stripe cells without trenched body contact according to the present invention.

FIG. 12 shows another preferred embodiment of the present invention, which is also the $X_1$-$X_2$ cross section in FIG. 13, wherein the disclosed trench MOSFET cell has a similar structure to that in FIG. 11 except that, there is no trenched body contact extending into the second type P body region 705 so that the second type P body region 705 between a first trenched gate 719 and the adjacent second type trenched gate 712 is not connected to the n+ source regions 706 and having floating voltage. The N-channel trench MOSFET further comprises a plurality of closed transistor cells, having top view as shown in FIG. 13 or a plurality of stripe transistor cells, having top view as shown in FIG. 14.

Figure 15:
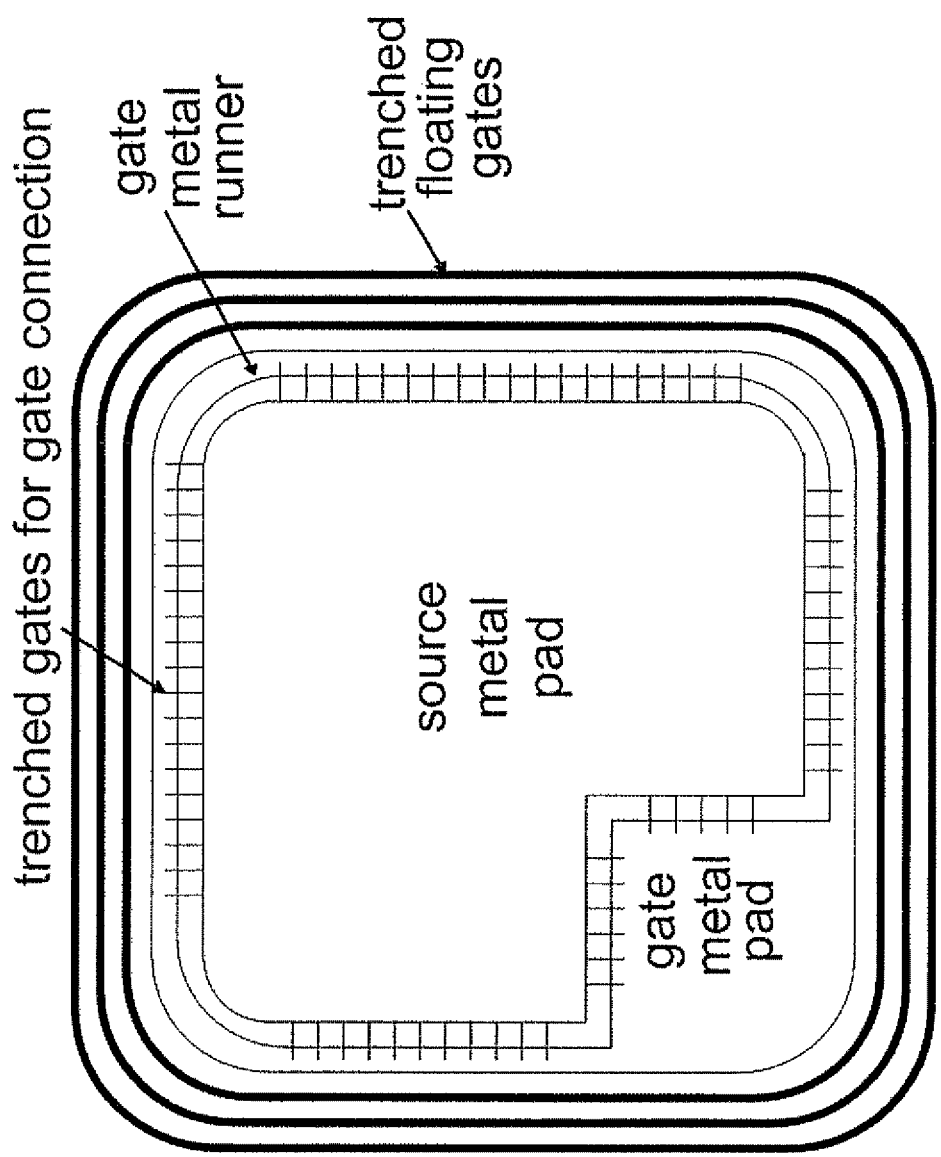
FIG. 15 is top view of a trench MOSFET with gate metal runner according to the present invention.

FIG. 15 shows that the second type trenched gate for gate connection is formed underneath the gate metal pad as well as underneath a gate metal runner which surrounds outside the source metal and extends to the gate metal pad, wherein the gate metal runner is also surrounded by the trenched floating gates in the termination area.

Figure 16:
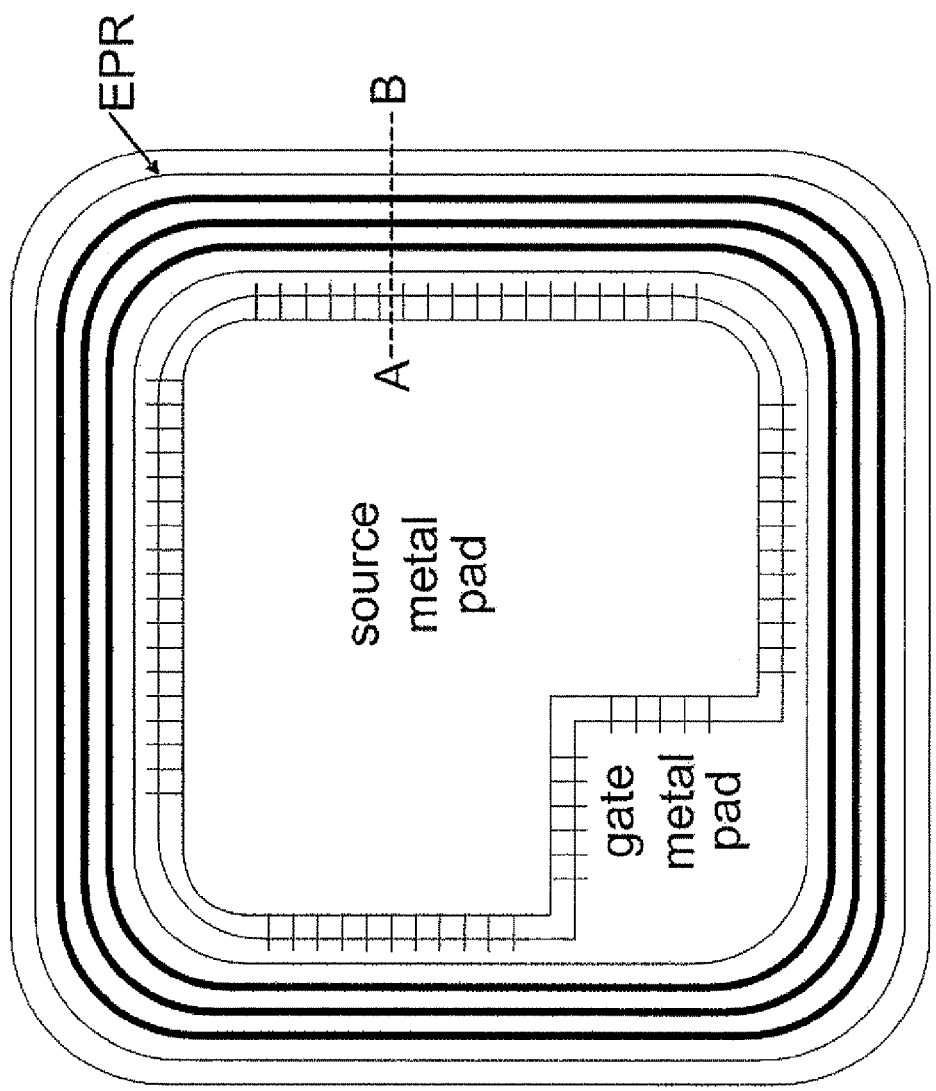
FIG. 16 is top view of a trench MOSFET with EPR and gate metal runner according to the present invention.

FIG. 16 shows a similar top view to FIG. 15 except that, an EPR is formed in the termination area around outside of the trenched floating gates.

Figure 17:
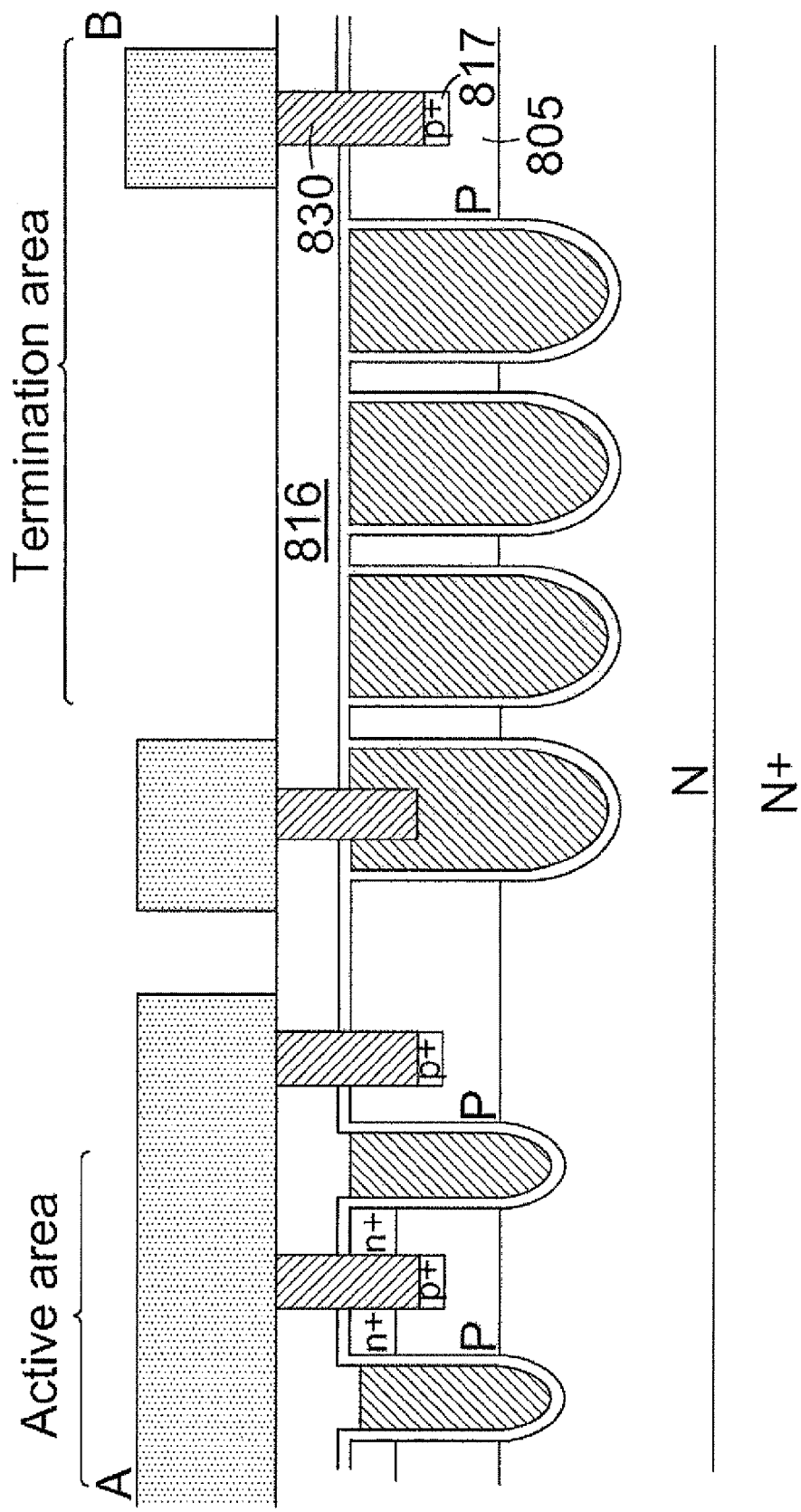
FIG. 17 is a preferred A-B cross-sectional view of FIG. 16.

FIG. 17 shows a preferred A-B cross section of FIG. 16 which has a similar structure to FIG. 10 except that, the termination area further comprises an EPR metal plug penetrating through the contact insulation layer 816 and extending into the second type P body region 805 adjacent the edge of the device, wherein the EPR metal plug 830 is tungsten metal plug padded by a barrier layer of Ti/TiN or Co/TiN and formed at the same manufactured step as the metal plug filled in the trenched source-body contact. Underneath the EPR metal plug, the p+ body contact region 817 is formed surrounding bottom of the EPR metal plug 830 as surrounding the trenched source-body contact. Meanwhile, an ERR metal 820 such as Al alloys is formed onto the contact insulation layer 812 and covering the EPR metal plug 830.

Figure 18:
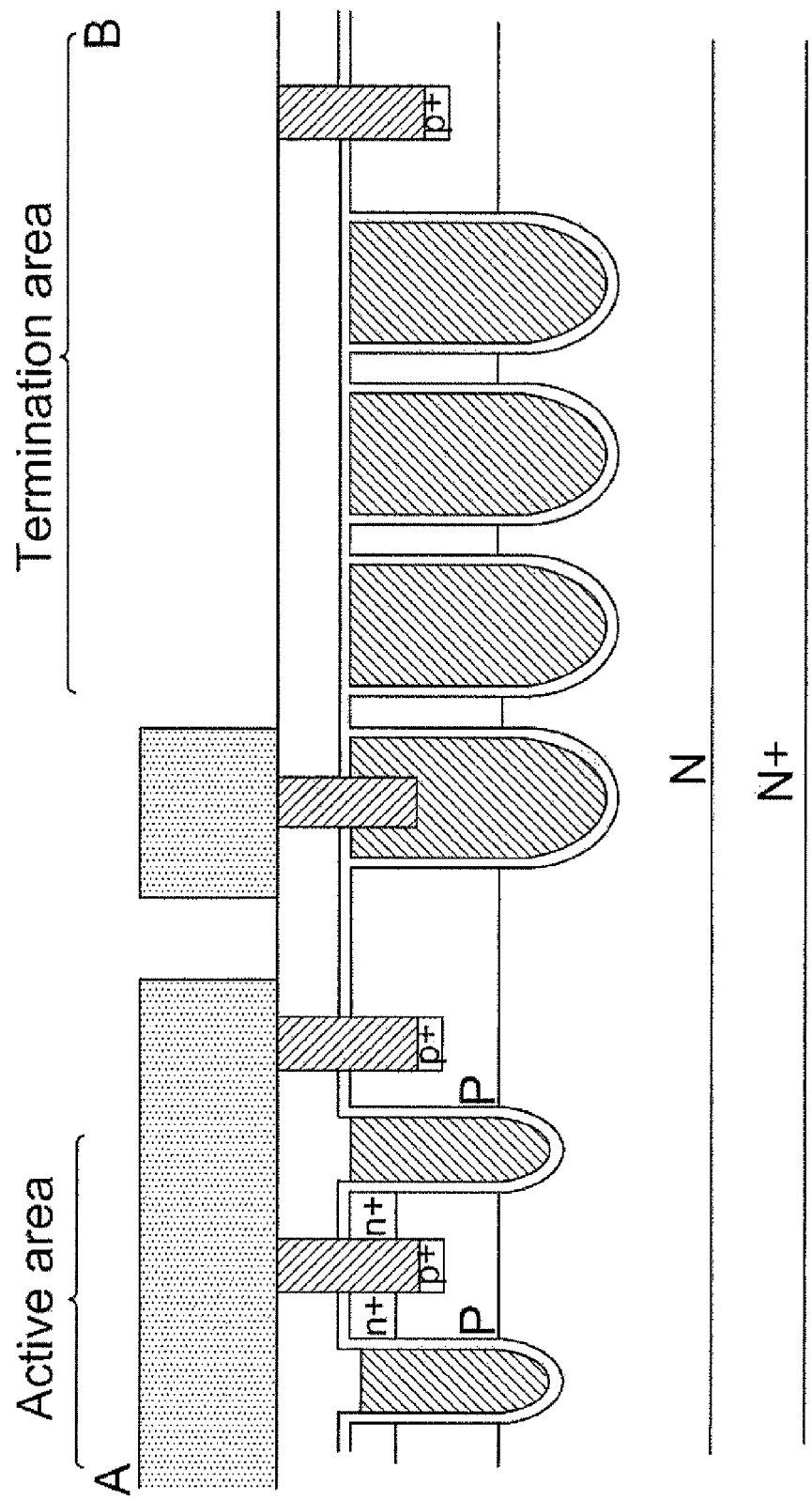
FIG. 18 is another preferred A-B cross-sectional view of FIG. 16.

FIG. 18 shows another preferred A-B cross section of FIG. 16 which has a similar structure to FIG. 17 except that, there is no EPR metal covering the EPR metal plug.

FIG. 19 is a top view of the trench MOSFET according to the present invention having no EPR and gate metal runner adjacent to the trenched floating gates in the termination area.

Although the present invention has been described in terms of the presently preferred embodiments, it is to be understood that such disclosure is not to be interpreted as limiting. Various alternations and modifications will not doubt become apparent to those skilled in the art reading the above disclosure. Accordingly, it is intended that the appended claims be interpreted as covering all alternations and modifications as fall within the true spirit and scope of the invention.

What is claimed is:

1. A trench MOSFET with a plurality of transistor cells in active area and multiple trenched floating gates in termination area, comprising:
   a substrate of a first conductivity type;
   an epitaxial layer of said first conductivity type onto said substrate, said epitaxial layer having a lower doping concentration than said substrate;
   a plurality of source regions of said first conductivity type formed near top surface of said epitaxial layer only within said active area, said source region having a doping concentration higher than said epitaxial layer;
   a plurality of first type body regions of a second conductivity type formed underneath said source region in said active area;
   a plurality of second type body regions of said second conductivity type formed in said epitaxial layer from top surface of said epitaxial layer around outside of said active area including said termination area, and said source regions being not disposed on the top of said second type body regions;
   a plurality of first type trenched gates in said active area surrounded by said source regions and said first type body regions, extending into said epitaxial layer;
   at least one second type trenched gate having a greater trench width and trench depth than said first type trenched gates in said active area and extending to said first type trenched gates, wherein said second type trenched gate surrounded by said second type body regions is extending into said epitaxial layer;
   an equal potential ring in said termination area and surrounding outside of said trenched floating gates; wherein
   said second type trenched gate is connecting to a gate metal pad used for wire bonding;
   said multiple trenched floating gates in parallel formed in said termination area around outside of said active area are having floating voltage and surrounded by said second type body regions, and having trench depth equal to or deeper than body junction of said second type body region; and
   said second type body regions between two adjacent of said trenched floating gates in said termination area are having floating voltage.

2. The trench MOSFET of claim 1, wherein said second type trenched gate for connection of said first type trenched gates is only disposed underneath said gate metal pad.

3. The trench MOSFET of claim 1 further comprising a gate metal runner surrounding outside of said active area and extending to said gate metal pad, and said second type trenched gate is disposed not only underneath said gate metal pad, but also underneath said gate metal runner.

4. The trench MOSFET of claim 1, wherein said equal potential ring further comprising an EPR metal plug penetrating through a contact insulation layer and extending into said second type body region, said EPR metal plug is Tungsten padded by a barrier layer of Ti/TiN or Co/TiN.

5. The trench MOSFET of claim 1, wherein said equal potential ring further comprising an EPR metal covering said EPR metal plug, wherein said EPR metal is Al alloys disposed onto said contact insulation layer.

* * * * *